(12) United States Patent
Kurosu et al.

(10) Patent No.: US 6,262,584 B1
(45) Date of Patent: Jul. 17, 2001

(54) IC DEVICE TEMPERATURE CONTROL SYSTEM AND IC DEVICE INSPECTION APPARATUS INCORPORATING THE SAME

(75) Inventors: Osamu Kurosu, Hobara-machi; Kazuhiro Kawaguchi, Kikuchi, both of (JP)

(73) Assignee: McElectronics Co., Ltd., Kumamoto (JP)

( * ) Notice: Subject to any disclaimer, the term of this patent is extended or adjusted under 35 U.S.C. 154(b) by 0 days.

(21) Appl. No.: 09/408,777

(22) Filed: Sep. 29, 1999

(30) Foreign Application Priority Data

Mar. 31, 1999 (JP) ................................ 11-092065

(51) Int. Cl.[7] ................................................. F25B 29/00
(52) U.S. Cl. ..................... 324/760; 324/158.1; 324/224
(58) Field of Search ................................. 324/760, 765, 324/754, 755, 158.1, 750, 248, 224; 374/5; 209/537; 713/312

(56) References Cited

U.S. PATENT DOCUMENTS

| | | | |
|---|---|---|---|
| 4,954,774 | * 9/1990 | Binet | 324/158.1 |
| 5,473,259 | * 12/1995 | Takeda | 324/760 |
| 5,742,168 | * 4/1998 | Kiyokawa et al. | 324/754 |
| 5,834,938 | * 11/1998 | Odawara et al. | 324/248 |
| 5,929,643 | * 7/1999 | Sakai et al. | 324/750 |
| 5,977,785 | * 11/1999 | Burward Hoy | 324/760 |
| 6,033,107 | * 3/2000 | Farina et al. | 374/5 |
| 6,043,671 | * 3/2000 | Mizuta | 324/765 |
| 6,064,220 | * 5/2000 | Sugasawara et al. | 324/765 |
| 6,104,204 | * 8/2000 | Hayama et al. | 324/760 |

FOREIGN PATENT DOCUMENTS 6-188295   7/1994   (JP) .

* cited by examiner

*Primary Examiner*—Safet Metjahic
*Assistant Examiner*—Jimmy Nguyen
(74) *Attorney, Agent, or Firm*—Frishauf, Holtz, Goodman, Langer & Chick, P.C.

(57) ABSTRACT

An IC device temperature control system is provided which includes a magnetometric sensor that detects a magnetic field generated around an IC device received in a chamber for inspection when electric current is supplied to the IC device, and a converter that converts an output signal from the magnetometric sensor to information indicative of an amount of heat generated by the IC device. A temperature control device controls a temperature of the IC device, and a control unit controls the temperature control device to maintain the temperature of the IC device within a predetermined range based on the information indicative of the amount of heat generated by the IC device.

7 Claims, 6 Drawing Sheets

IC DEVICE TEMPERATURE CONTROL SYSTEM AND IC DEVICE INSPECTION APPARATUS INCORPORATING THE SAME

BACKGROUND OF THE INVENTION

1. Field of the Invention

This invention relates to an IC device temperature control system which makes it possible to evaluate performance of an IC device correctly and an IC device inspection apparatus incorporating the IC device temperature control system.

2. Description of the Prior Art

Inspection of temperature characteristics of an IC device is carried out in an environment which is held at a predetermined temperature (thermostatic bath or chamber).

The temperature set point of the chamber is set e.g. at −50° C. to +150° C. according to inspection programs.

Further, electric current is supplied to the IC device under test in various patterns according to many different test items of an inspection program. As a result, the IC device generates heat by Joule's law in a different pattern, dependent on the test item. The heat generation is more conspicuous in the case of inspecting an IC device which has a high integration density, such as a microprocessor (MPU) installed in a computer.

In recent years, the processing capacity or speed of microprocessors has been markedly increased, and their integration density has also become higher, resulting in an increased watt density (W/cm$^2$) of such a microprocessor under test. Therefore, IC devices including MPUs tend to generate a still larger amount of heat.

For example, when a microprocessor generates approximately 30 watts of heat during inspection, the temperature of the microprocessor becomes higher than the set point temperature of the chamber by 40° C. or so.

Further, the amount of heat generated by an IC device becomes larger as the frequency of an electric signal supplied thereto.

Moreover, it is reported that the maximum operating frequency of the microprocessor is lowered with an increase in the temperature of the same due to a lowered switching frequency of transistors, and that if the temperature of the microprocessor rises by 10° C., the maximum operating frequency of the same is reduced by 2%.

For example, when the temperature of a microprocessor capable of operating at a maximum operating frequency of 500 MHz becomes 40° C. higher than the set point temperature of the chamber, the actual maximum operating frequency of the microprocessor falls by no less than 40 MHz. Therefore, the microprocessor which should be ranked in itself in a class in which operation at 500 MHz is ensured is demoted by one grade or class as a microprocessor for operation on the order of 400 MHz.

As a result, yields of microprocessors for operation at high operating frequencies are unduly deteriorated, causing a serious loss.

Further, when there is an increase in heat generation, an IC device is in danger of destroying itself.

Conventionally, with a view to enhancing accuracy of inspection (i.e. yield of properly ranked IC devices) and preventing self-destruction of an IC device, the temperature of the IC device is monitored, and then the IC device is cooled to the set point temperature of the chamber.

The temperature of an IC device can be measured by a method using a contact temperature sensor such as a thermocouple or a non-contact temperature sensor such as an infrared sensor.

Further, another method can be employed in which a temperature sensor is incorporated in an IC device under test and the temperature of the IC device is measured by the temperature sensor, as disclosed in Japanese Laid-Open Patent Publication (Kokai) No. 6-188295.

However, the contact temperature sensor can scratch or soil a package surface of an IC device, causing degradation of the product.

On the other hand, the non-contact temperature sensor such as an infrared sensor cannot measure the temperature of an IC device having a metal surface accurately.

Further, the method using a temperature sensor incorporated in an IC device increases the size and weight of the IC device, resulting in a considerable increase in manufacturing costs of the product.

SUMMARY OF THE INVENTION

It is a first object of the invention to provide an IC device temperature control system which is capable of measuring the temperature of an IC device accurately without scratching or soiling the IC device which also it possible to evaluate performance of the IC device correctly even when a temperature sensor is not incorporated in the IC device.

It is a second object of the invention to provide an IC device inspection apparatus incorporating the IC device temperature control system.

To attain the first object, according to a first aspect of the invention, there is provided An IC device temperature control system for controlling a temperature of an IC device received in a chamber, for inspection, the IC device temperature control system, comprising:

magnetometric detection means for detecting a magnetic field generated around the IC device when electric current is supplied to the IC device;

temperature control means for controlling a temperature of the IC device; and control means for controlling the temperature control means based on a signal delivered from the magnetometric detection means, to maintain the temperature of the IC device within a predetermined temperature range.

According to this IC device temperature control system, the magnetometric detection means detects a magnetic field which is generated by electric current supplied to an IC device under test in a manner momentarily varying in response to changes in the electric current. The control means issues an instruction to the temperature control means based on a detection signal delivered from the magnetometric detection means, and the temperature control means adjusts the temperature of the IC device according to the instruction (by cooling or heating).

Further, differently from an infrared sensor, the magnetometric detection means is capable of measuring the temperature of the IC device accurately even when the IC device has a metal surface. Also differently from a contact temperature sensor such as a thermocouple, the magnetometric detection means is not required to be brought into contact with the IC device, so that the IC device cannot be scratched or soiled. Moreover, since it is not required to incorporate a temperature sensor in the IC device as in the prior art, increases in size and weight of the IC device can be prevented.

A refrigerant used in the cooling means may be cold air produced e.g. by a refrigerator, cold air produced by adiabatic expansion caused by a difference in pressure between the inside and outside of a vortex of a gas rotating at an extremely high speed (i.e. cold air produced based on the vortex principle), gaseous nitrogen utilizing latent heat of vaporization of liquid nitrogen, or the like.

Preferably, the IC device temperature control includes conversion means for converting the signal delivered from the magnetometric detection means to information indicative of an amount of heat generated by the IC device, and the control means controls the temperature control means based on the information from the conversion means, to maintain the temperature of the IC device within the predetermined temperature range.

According to this preferred embodiment, the conversion means converts the detection signal delivered from the magnetometric detection means into information indicative of the amount of heat generated by the IC device. The control means issues an instruction to the cooling means based on the information, for cooling the IC device according to a change in the amount of the heat, and the cooling means cools the IC device according to the instruction.

More preferably, the control means adjusts an operating amount to be applied to the temperature control means to a predetermined value corresponding to a temperature change of the IC device, based on the information from the conversion means.

According to this preferred embodiment, the control means issues an instruction for adjusting the operating amount to be applied to the cooling means to a predetermined value corresponding to a change in temperature of the IC device, and the cooling means cools the IC device according to the instruction. Therefore, response of the system to the temperature change of the IC device is enhanced, which makes it possible to maintain the temperature change of the IC device within a small predetermined range, thereby allowing highly accurate inspection of the IC device.

Preferably, the magnetometric detection means comprises a magneto-resistive element whose resistance value varies with strength of the magnetic field.

According to this preferred embodiment, it is not required to bring the magneto-resistive element serving as magnetometric detection means into contact with the IC device, so that it is possible to prevent the IC device from being scratched or soiled.

Preferably, the temperature control means comprises cold air supply means for supplying a jet of cold air to the IC device, and the control means controls both of a time period over which the jet of cold air is supplied to the IC device and a flow rate of the jet of the cold air, in a feed forward manner based on the information from the conversion means.

According to this preferred embodiment, it is possible to control the time period and the flow rate of the jet of cold air to be delivered from the cold air supply means, to thereby maintain the temperature of the IC device within the predetermined temperature range.

More preferably, the cold air supply means comprises a cooling nozzle for delivering the jet of the cold air to the IC device, and a cooling jacket arranged around the cooling nozzle for permitting a refrigerant to flow therethrough to thereby inhibit a rise in a temperature of the cold air within the cooling nozzle.

According to this preferred embodiment, effects of cooling by the cooling jacket prevent the cooling nozzle in a standby state from being warmed by an ambient temperature within the chamber, to thereby prevent degradation of cooling efficiency due to an increase in the temperature of the cold air in the cooling nozzle.

To attain the second object, according to a second aspect of the invention, there is provided an IC device inspection apparatus, comprising:

a chamber for receiving therein an IC device under test;

an IC tester for judging performance of the IC device;

an IC socket for electrically connecting between the IC tester and the IC device;

magnetometric detection means for detecting a magnetic field generated around the IC device when electric current is supplied to the IC device;

temperature control means for controlling a temperature of the IC device;

device pressing means arranged above the IC socket, the device pressing means comprising two portions which are separated from each other when the IC device is set on the IC socket and when the IC device is removed from the IC socket, and connected into one piece when the IC device is inspected, the device pressing means having an opening defined therein at least during inspection of the IC device, for allowing the magnetometric detection means to detect the magnetic field generated around the IC device as well as allowing the temperature control means to control the temperature of the IC device;

an urging mechanism for urging the device pressing means downward so as to press the IC device against the IC socket when the IC device is inspected; and control means for controlling the temperature control means based on a signal delivered from the magnetometric detection means, to maintain the temperature of the IC device within a predetermined temperature range.

According to this IC device inspection apparatus, the opening is provided in the device pressing means for electrically connecting between the IC device and the IC tester. Therefore, it is possible to bring the magnetometric detection means close to the IC device via the opening during inspection, for detection of the magnetic field, and at the same time cool the IC device directly by the cooling means (e.g. by delivering jets of cold air directly onto the IC device).

To attain the second object, according to a third aspect of the invention, there is provided an IC device inspection apparatus comprising:

a chamber for receiving therein an IC device under test;

an IC tester for judging performance of the IC device;

an IC socket for electrically connecting between the IC tester and the IC device;

an IC device carrier head accommodated in the chamber, for setting the IC device on the IC socket before inspection, and removing and carrying the IC device from the IC socket after the inspection;

a plurality of device pressers mounted at the IC device carrier head, the device pressers being lowered together with the IC device carrier head when the IC device is inspected, so as to press the IC device against the IC socket;

magnetometric detection means for detecting a magnetic field generated around the IC device when electric current is supplied to the IC device;

temperature control means for controlling a temperature of the IC device; and control means for controlling the temperature control means based on a signal delivered from the magnetometric detection means, to maintain the temperature of the IC device within a predetermined temperature range, wherein the chamber has a bottom plate formed with an opening extending therethrough, the IC device being inserted in the opening.

This IC device inspection apparatus provides the same effects as obtained by the IC device inspection apparatus according to the second aspect of the invention. Further, since the plurality of device pressers are mounted at the IC device carrier head, it is possible to simplify the construction around the IC device carrier head.

The above and other objects, features and advantages of the present invention will become more apparent from the following detailed description taken in conjunction with accompanying drawings.

DETAILED DESCRIPTION OF THE PREFERRED EMBODIMENTS

The invention will now be described in detail with reference to drawings showing preferred embodiments thereof.

Figure 1:
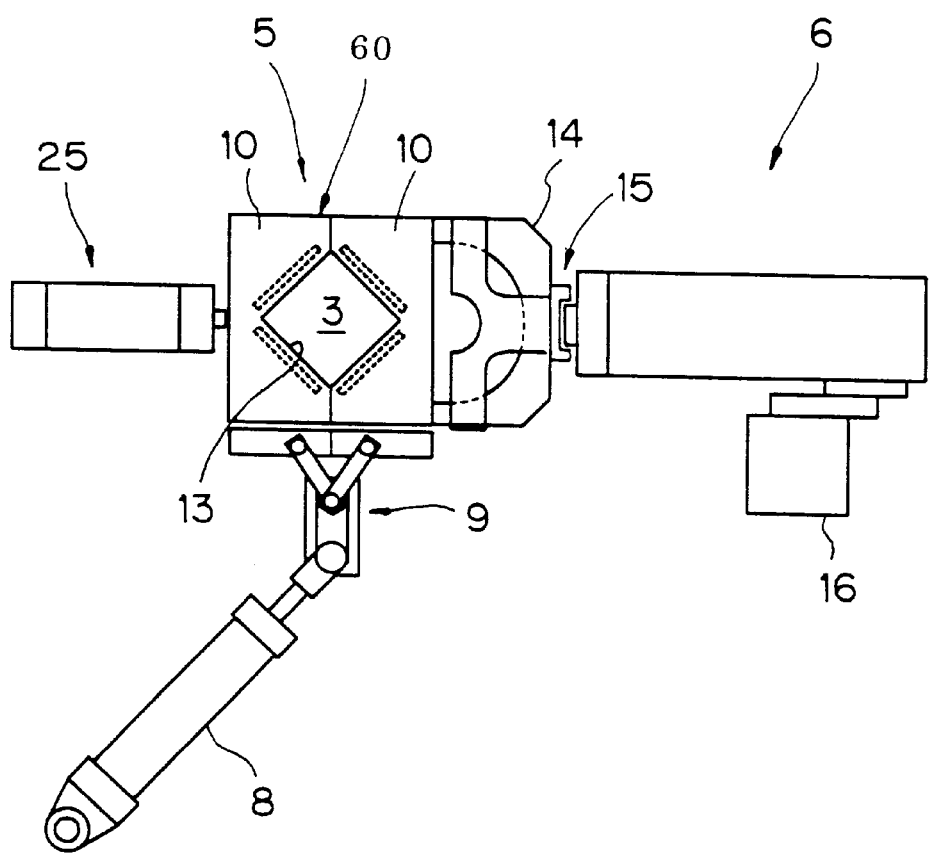
FIG. 1 is a plan view showing part of an IC device inspection apparatus according to an embodiment of the invention.
Figure 2:
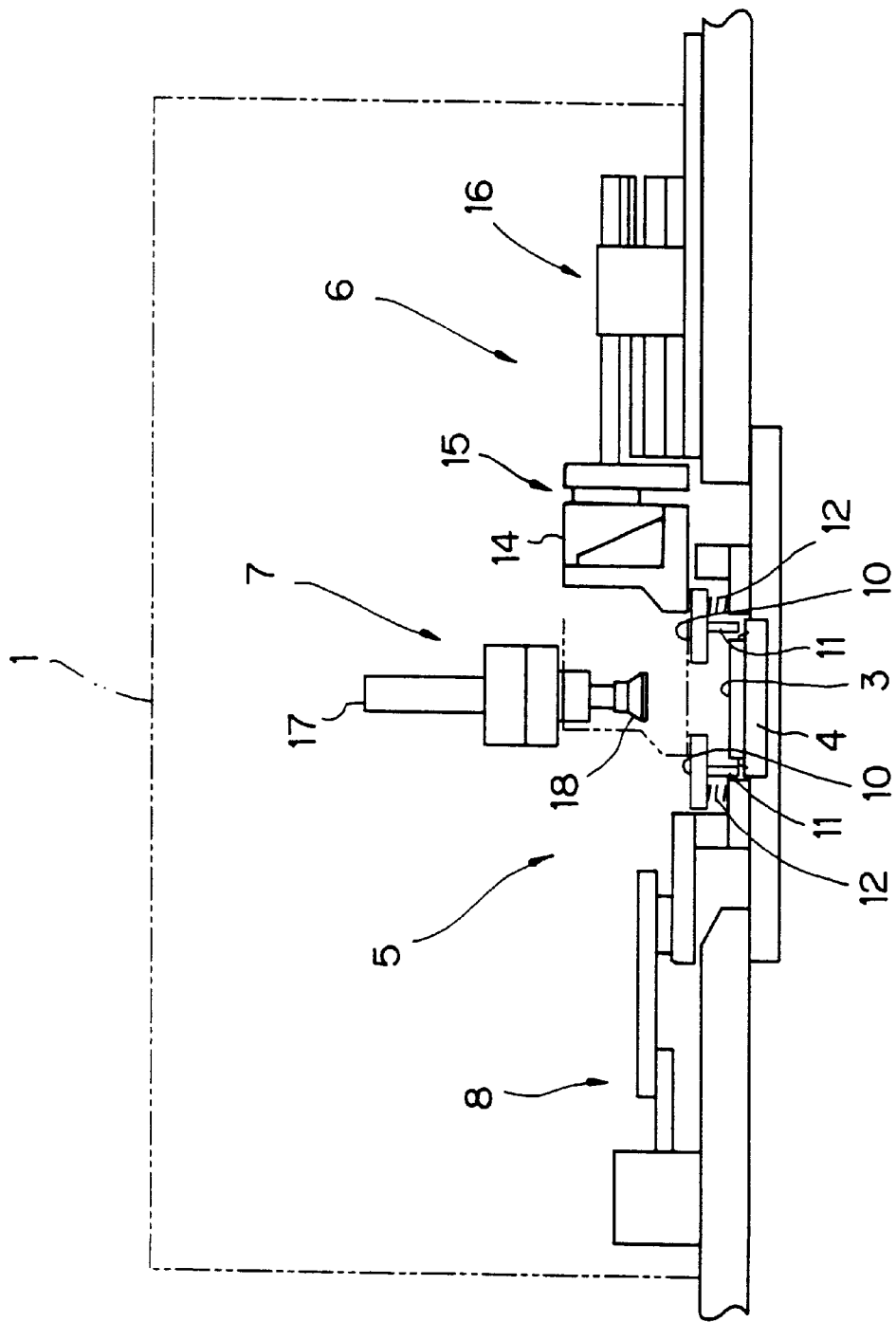
FIG. 2 is a schematic cross-sectional view of the FIG. 1 IC device inspection apparatus.
Figure 3:
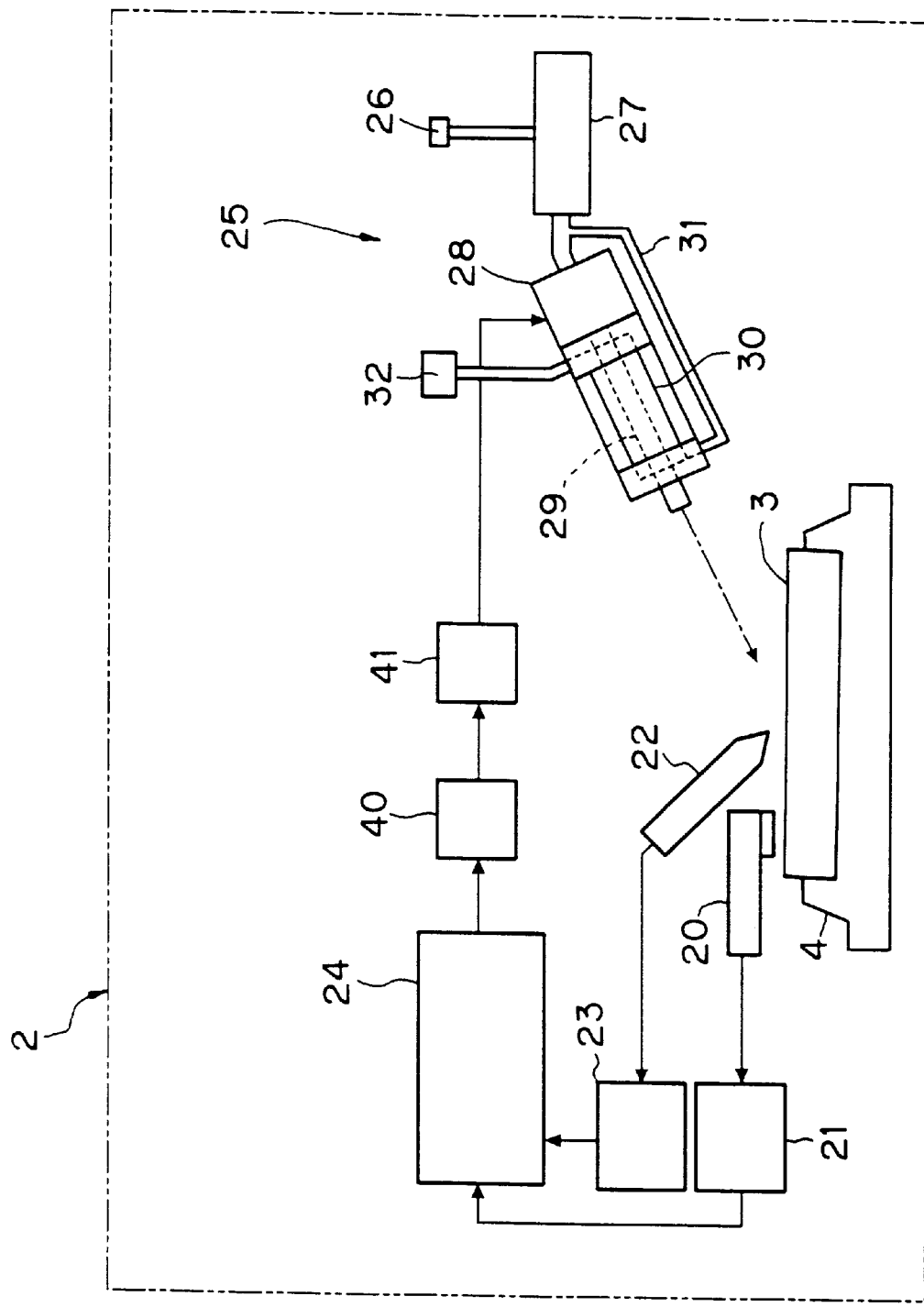
FIG. 3 is a block diagram showing an IC device temperature control system according to the embodiment.
Figure 4:
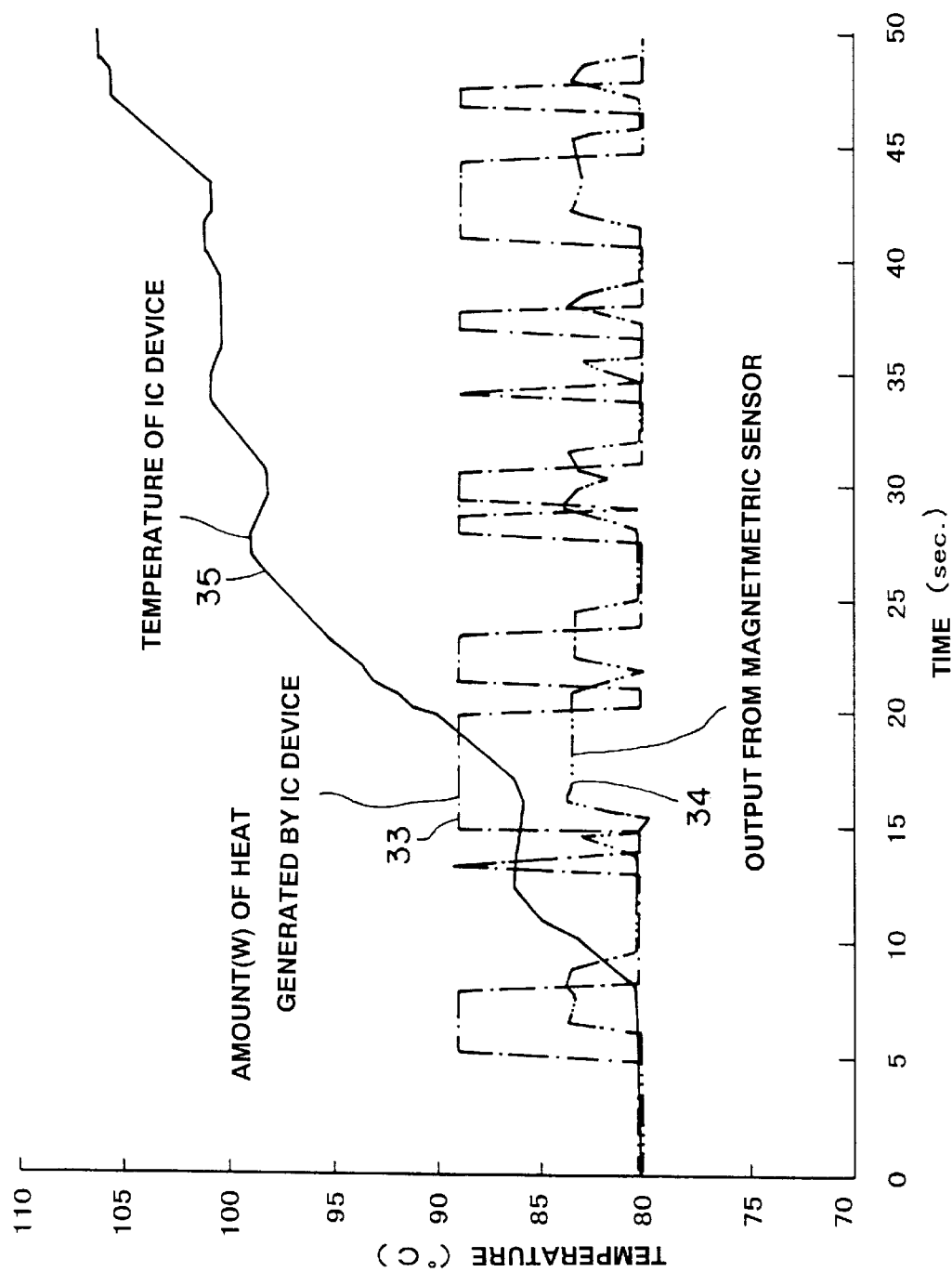
FIG. 4 is a graph showing the relationship between an output from a magnetometric sensor and the amount of heat generated by the IC device.
Figure 5:
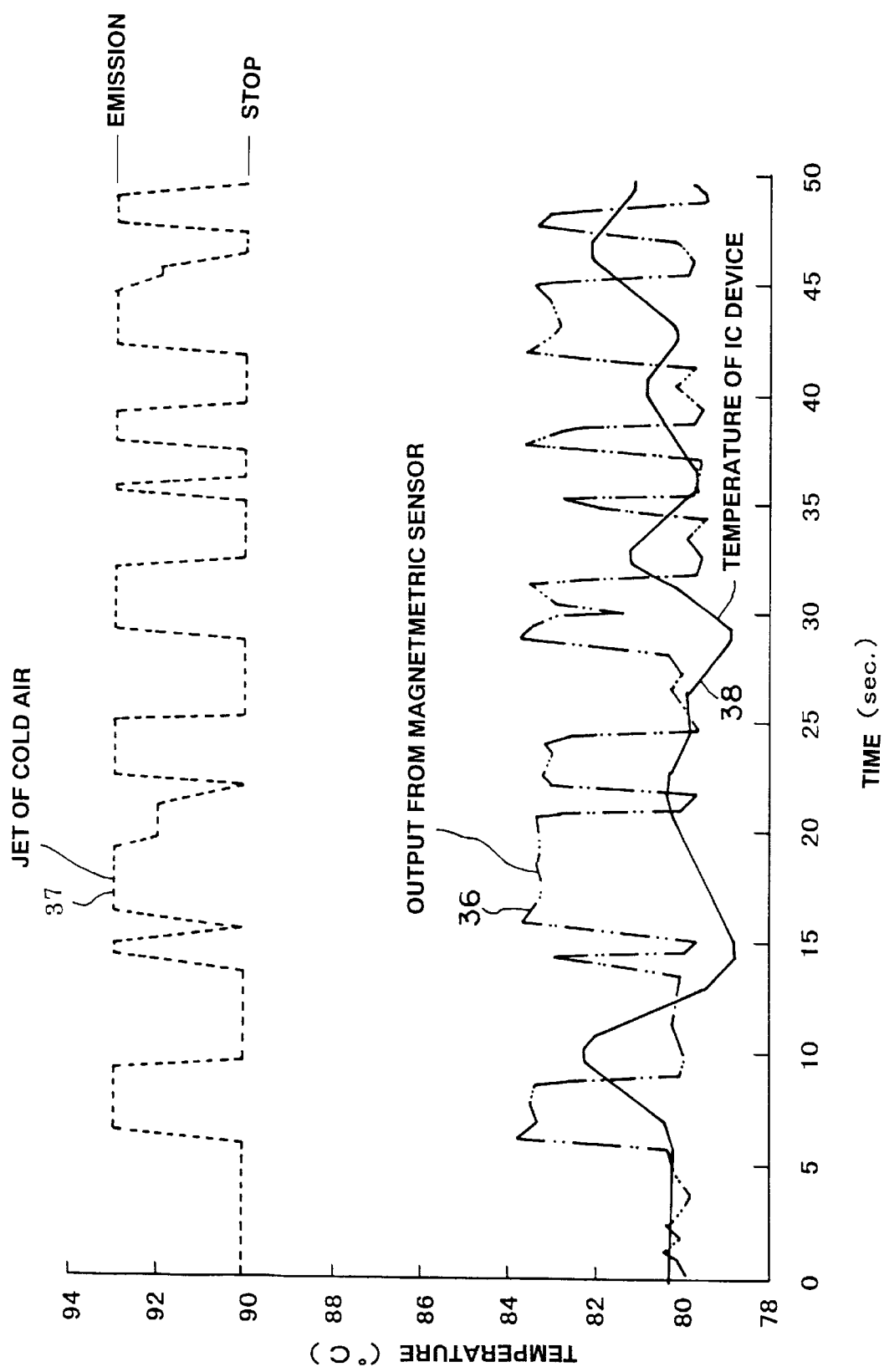
FIG. 5 is a graph showing the relationship between timing of delivery of jets of cold air and the temperature of the IC device.

FIG. 1 shows part of an IC device inspection apparatus according to an embodiment of the present invention. FIG. 2 schematically shows the FIG. 1 apparatus in cross section, and FIG. 3 is a block diagram showing an IC device temperature control system incorporated in the IC device inspection apparatus, according to the embodiment of the invention. FIG. 4 is a graph showing the relationship between an output from a magnetometric sensor and the amount of heat generated by the IC device, while FIG. 5 is a graph showing the relationship between timing of delivery of jets of cold air and the temperature of the IC device.

The IC device inspection apparatus is comprised of an IC socket 4, a contact opening/closing mechanism 5, a spacer mechanism 6, an IC device carrier head 7, a temperature control system (IC device temperature control system) 2, etc. The IC socket 4 and other components are accommodated in a chamber 1. The inside of the chamber 1 is held at a predetermined set point temperature. The contact opening/closing mechanism 5, the spacer mechanism 6, and the IC device carrier head 7 constitute an urging mechanism.

The contact opening/closing mechanism 5 includes device pressing means 60, an actuator 8, a linkage 9, and a pair of return springs 12. The return springs 12 constantly urge a pair of presser plates 10 upward.

The device pressing means 60 is comprised of the pair of presser plates 10, 10 each having a device presser 11 in the form of a plate. The two device pressers 11, 11 are formed in parallel with each other such that they each extend vertically from a central portion of an underside surface of the corresponding presser plate 10. The device pressing means 60 is opened and closed by the actuator 8 via the linkage 9. FIG. 1 shows a state of the two presser plates 10, 10 being connected together into a unitary member, while FIG. 2 shows a state of the presser plates 10, 10 being separated from each other.

As shown in FIG. 1, when the two presser plates 10, 10 are connected together into a unitary member, a square opening 13 is formed in a central portion of the connected plates 10, 10.

The spacer mechanism 6 includes a spacer block 14, a slide mechanism 15, and an actuator 16.

The actuator 16 causes the spacer block 14 to reciprocate between two positions indicated, respectively, by solid lines and broken lines appearing in FIG. 2. Further, the spacer block 14 can be slid vertically by the slide mechanism 15.

As shown in FIG. 2, the IC device carrier head 7 is comprised of a vacuum pipe 17 and a vacuum nozzle 18 mounted at a lower end of the vacuum pipe 17. At an upper portion of the IC device carrier head 7, there is arranged a motor, not shown, for driving the IC device carrier head 7 vertically.

The IC device carrier head 7 picks up an IC device 3 by vacuum from a standby tray, not shown, before inspection and sets the same on the IC socket 4. After the inspection, the IC device carrier head 7 picks up the IC device 3 from the IC socket 4 to place the same on a product tray, not shown.

At this time, the presser plates 10, 10 of the contact opening/closing mechanism 5 are separated from each other by the actuator 8. At the same time, the spacer block 14 of the space mechanism 6 is moved back to the position indicated by the solid lines in FIG. 2, whereby interference between the IC device carrier head 7 or the IC device 3 and the presser plates 10, 10 or the spacer block 14 is avoided.

On the other hand, during the inspection of the IC device, the presser plates 10, 10 are connected together into a unitary member, and the spacer block 14 is moved to the position indicated by the broken lines in FIG. 2. Then, the IC device carrier head 7 urges the spacer block 14 and the presser plates 10, 10 downward to cause the device presser 11 to press the IC device 3 against the IC socket 4, whereby electrical connection between the IC device 3 and an IC tester 44 is maintained.

After the IC device 3 has been set on the IC socket 4, electric current is supplied to the IC device 3 from the IC tester 44 in predetermined patterns according to an inspection program for execution of various tests.

When the inspection is completed, the presser plates 10, 10 are separated from each other, and the spacer block 14 is moved back to the position indicated by the solid lines in FIG. 2. Then, the IC device 3 is carried onto the product tray by the IC device carrier head 7.

Further, when the IC device carrier head 7 is lifted after the inspection of the IC device 3, the presser plates 10, 10 which were urged downward by the IC device carrier head 7 via the spacer block 14 during the inspection are each moved back to its former position by an urging force of a corresponding one of the return springs 12.

Reference numeral 45 appearing in FIG. 2 designates a printed circuit board for electrically connecting between the IC tester 44 and the IC device 3. The IC tester 44 is connected to a bottom plate 1a of the chamber 1 via the printed circuit board 45.

As shown in FIG. 3, the temperature control system 2 includes the magnetometric sensor (magnetometric detection means) 20 comprised e.g. of a magneto-resistive element, an A/D converter (conversion means) 21, a temperature sensor (contact temperature-measuring element) 22, an A/D converter 23, a control unit (control means) 24, a D/A converter 40, a valve controller 41, and a cold air delivery device (cold air supply means) 25 serving as cooling means (temperature control means).

The cold air delivery device 25 includes a refrigerant inlet port 26, a cooler 27, a proportional control valve 28, a cooling nozzle 29, a cooling jacket 30, a branch channel 31 for passage of cold air therethrough, and a refrigerant outlet port 32.

Compressed dry air is introduced from the refrigerant inlet port 26 and sent into the cooler 27 at a high speed in a circumferential direction.

The cooler 27 operates on the vortex principle for cooling air, and creates an ultra-fast vortex flow from the compressed air drawn therein. This vortex flow generates a pressure difference between the inside and outside the vortex, as a result of which the air flows from a high-pressure side to a low-pressure side, whereby the temperature of the air falls through adiabatic expansion.

The cold air generated in a central portion of the cooler 27 is sent to the cooling nozzle 29 via the proportional control valve 28.

The proportional control valve 28 is a valve for controlling the amount of a jet of cold air for delivery. As described hereinafter, an operating amount (amount of adjustment of opening) of the proportional control valve 28 is controlled by the control unit 24 to a predetermined value dependent on the amount of heat generated by the IC device 3. More specifically, the control unit 24 determines the amount of the generated heat based on an output from the A/D converter 21, and instructs the cold air delivery device 25 to deliver a jet of cold air in a blowing pattern corresponding to the determined amount of the heat.

The cold air delivered from the cooling nozzles 29 is blown onto the IC device 3 on the IC socket 4 through the opening 13 of the connected presser plates 10, 10 of the contact opening/closing mechanism 5. Since the jet of cold air is delivered in the blowing pattern corresponding to the amount of the generated heat, the temperature of the IC device 3 is prevented from largely deviating from the set point temperature of the chamber 1.

The cooling jacket 30 is arranged in a manner enclosing the cooling nozzle 29. That is, the cooling jacket 30 and the cooling nozzle 29 form a double tube. Part of the cold air in the cooler 27 is supplied via the branch channel 31 to the cooling jacket 30 as an outer tube, and discharged from the refrigerant outlet port 32, whereby cold air in the cooling nozzle 29 as an inner tube is cooled by the cold air in the cooling jacket 30 and held at a predetermined temperature.

Effects of cooling by the cooling jacket 30 prevent the cooling nozzle 29 in a standby state from being warmed by an ambient temperature within the chamber 1, to thereby prevent degradation of cooling efficiency due to an increase in the temperature of the cold air in the cooling nozzle 29.

When the electric current is supplied to the IC device 3 on the IC socket 4, a magnetic field is generated around the IC device 3.

The magnetometric sensor 20 is brought toward the IC device 3 through the opening 13 of the connected presser plates 10, 10, to detect the magnetic field formed around the IC device 3, in a non-contact manner, and then deliver an electric signal which varies with strength of the magnetic field. The electric signal is converted to a digital signal by the A/D converter 23 and sent to the control unit 24 comprised of a CPU, etc.

The control unit 24 selects a suitable blowing pattern (including a time period over which a jet of cold air is delivered, a time interval of delivery of jets of cold air, the flow rate of a jet of cold air, etc.) out of a plurality of blowing patterns provided in advance, based on the amount of the heat generated by the IC device 3 under test, and then instructs the cold air delivery device 25 to blow or deliver a jet of cold air onto the IC device 3 in the selected blowing pattern.

The control unit 24 carries out adjustment of the opening of the proportional valve 28 by feed forward control.

A signal delivered from the control unit 24 is converted to an analog signal by the D/A converter 40 and sent to the valve controller 41, from which a signal for controlling the flow rate of the cold air is delivered to the proportional control valve 28 of the cold air delivery device 25. Thus, the opening of the proportional control valve 28 is adjusted, and the IC device 3 is cooled by a jet of cold air delivered from the cooling nozzle 29.

Conventionally, the temperature of an IC device 3 under test changes sharply with the value of electric current supplied to the IC device 3. However, the feed forward control performed in the present embodiment is very excellent in the response to changes of a control object, making it possible to hold the temperature of the IC device 3 generally constant in response to sharp temperature changes even in an inspection program in which the current value fluctuates sharply in complicated patterns. Incidentally, feedback control in which control is carried out based on the difference between a result of control and a desired value is slower in response since it is required to wait for the result, which makes it difficult to properly respond to the sharp changes in the temperature of the IC device 3.

The temperature sensor 22 detects a surface temperature of the IC device 3. A detection signal delivered from the temperature sensor 22 is converted to a digital single by the A/D converter 23 and sent to the control unit 24. The control unit 24 displays the surface temperature of the IC device 3 on a display screen, not shown. The temperature display is utilized by an operator for monitoring the inspection apparatus 1 and an operating state of the temperature control system 2.

Next, cooling effects of the temperature control system 2 on the IC device 3 will be described with reference to FIGS. 4 and 5.

FIG. 4 shows various data collected in setting a blowing pattern for the IC device 3. A one-dot chain line 33 shows the amount of heat (W) generated by the IC device 3, while a two-dot chain line 34 shows an output from the magnetometric sensor 20 for detecting the magnetic field generated around the IC device. A solid line 35 shows the temperature of the IC device 3 which is measured when the IC device 3 is not cooled by cold air. There is a correlation between the output from the magnetometric sensor 20 (strength of the magnetic field) and the amount of heat (W) generated by the IC device 3.

As shown by the above-mentioned lines, when electric current is passed through the IC device 3, the strength of the magnetic field and the amount of heat generated by the IC device fluctuate in accordance with patterns in which the electric current is supplied. The temperature of the IC device 3 rises with the lapse of time.

FIG. 5 shows cold air-blowing patterns of cold air in which jets of cold air are delivered by the temperature control system 2 and changes in the temperature of the IC device 3. A two-dot chain line 36 shows the output from the magnetometric sensor 20, while a broken line 37 shows states of delivery and stoppage of jets of cold air. A solid line 38 shows changes in the temperature of the IC device 3 cooled by the cold air.

Each of the cold air-blowing patterns is set such that it corresponds to a change in the amount of the heat generated by the IC device 3. Each time period over which a jet of cold air is delivered, time intervals of delivery of jets, and the amount of cold air delivered by the jet, all of which are represented by the broken line 37 in FIG. 5, are delicately adjusted according to a corresponding change in the temperature of the IC device 3 indicated by the solid line 38 in the figure.

Consequently, as shown by the solid line 38, although the temperature of the IC device 3 changes with the lapse of time, the change in the temperature is held within a range of ±2° C.

According to the present embodiment, it is possible to measure changes in the temperature of the IC device 3 accurately without scratching or soiling a package of the IC device 3. Further, the embodiment enables correct evaluation of performance of the IC device 3 without any need to incorporate a temperature sensor in the IC sensor 3, which contributes to reduction of manufacturing costs of the IC device 3.

Moreover, according to the present embodiment, the control unit 24 estimates each change in the temperature of the IC device 3, based on information of the amount of the generated heat from the A/D converter 21, and then delivers a control signal for adjusting an operating amount to be applied to the proportional valve 28 of the cold air delivery device 25 to a predetermined value corresponding to the estimated temperature change, to thereby cause the cold air delivery device 25 to appropriately cool the IC device 3. Therefore, the IC device inspection apparatus has enhanced response to the temperature change of the IC device 3, and hence is capable of maintaining the temperature of the IC device 3 within a small predetermined temperature range (between temperatures which are 2° C. higher and lower, respectively, than the set point temperature of the chamber 1), differently from the prior art in which the temperature of the IC device 3 under test fluctuates sharply with changes in value of the electric current supplied to the IC device 3. This enable the apparatus to carry out highly accurate Inspection.

Further, since it Is not required to bring the magnetometric sensor 20 into contact with the IC device 3 in detecting the magnetic field, the IC device cannot be scratched or soiled.

Further, it is possible to prevent the cooling nozzle 25 in a standby state from being warmed by the ambient temperature within the chamber 1, to thereby prevent the temperature of the cold air from rising, so that cooling efficiency of the cold air delivery device 25 can be enhanced.

Still further, according to the embodiment, through the opening 13 of the device pressing means 60, the magnetometric sensor 20 can be brought toward the IC device 3 so as to detect the magnetic field during inspection of the IC device 3, and at the same time cold air can be directly blown from the cooling nozzle 29 onto the IC device 3.

Although in the above embodiment, the cold air produced by the device utilizing the vortex principle is used for cooling the IC device 3, this is not limitative, but cold air produced e.g. by compressing a gas by the use of a compressor and then expanding the same adiabatically, or gaseous nitrogen utilizing latent heat of vaporization of liquid nitrogen may be used for the purpose.

As far as the magnetometric sensor is concerned, any element, such as a Hall element or an electromagnetic induction coil, which is capable of detecting the magnetic field, may be used in place of the magneto-resistive element.

Figure 6:
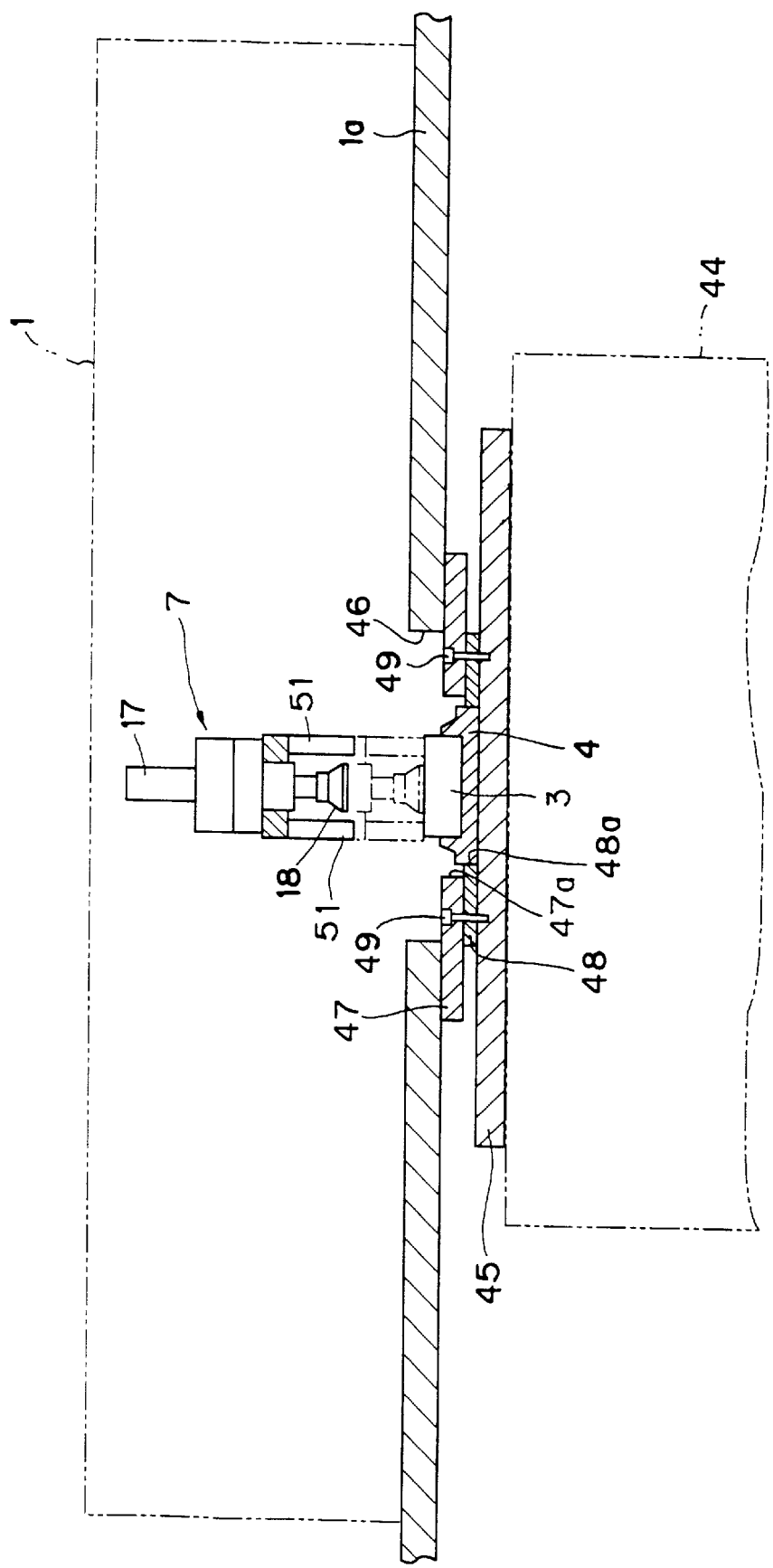
FIG. 6 is a cross-sectional view showing part of an IC device inspection apparatus according to another embodiment of the invention.

Referring next to FIG. 6, there is shown part of an IC device inspection apparatus according to another embodiment of the invention.

This embodiment is distinguished from the above embodiment in that the various mechanisms (such as the contact opening/closing mechanism 5, the spacer mechanism 6, etc.) associated with the device carrier head 7 are dispensed with. In respect of other (e.g. a temperature control system) than these, the arrangement of the present embodiment is similar to that of the above embodiment, so that detailed description thereof is omitted.

Now, description will be made mainly of differences between the two embodiments.

An IC tester 44 judges performance of an IC device 3. The IC tester 44 is connected to a bottom plate 1a of a chamber 1 via a printed circuit board 45.

The bottom plate 1a of the chamber 1 has an opening 46 formed through a central portion thereof, and mounting plate 47 is secured to a periphery of the opening 46.

The printed circuit board 45 electrically connects between the IC tester 44 and the IC device 3. The printed circuit board 45 is fixedly arranged on the top of the IC tester 44, i.e. located outside the chamber 1. At a central portion of the printed circuit board 45, there is fixedly mounted a socket guide plate 48 formed of an insulating material. The socket guide plate 48 is formed with a central hole 48a in which an IC socket 4 is fitted. The IC device 3 is set on the printed circuit board 45 via the IC socket 4.

In connecting the IC tester 44 to the bottom plate 1a of the chamber 1, the IC socket 4 is inserted into the central hole 47a of the mounting plate 47, and then the mounting plate 47 and the printed circuit board 45 are fixed to each other by fixing screws 49 via the socket guide plate 48. The IC socket 4 and the IC device 3 face the inner space of the chamber 1 through the opening 46 of the bottom plate 1a of the chamber 1. Incidentally, the mounting plate 47 and the socket guide plate 48 are not shown in FIG. 1.

An IC device carrier head 7 is comprised of a vacuum pipe 17, a vacuum nozzle 18 mounted at a lower end of the vacuum pipe 17, a plurality of device pressers 51, and nozzle lifting/lowering means, not shown. At an upper portion of the IC device carrier head 7, there is arranged a motor, not shown, for driving the IC device carrier head 7 vertically. The IC device carrier head 7 is accommodated in the chamber 1. The inside of the chamber 1 is held at a predetermined set point temperature.

The IC device carrier head 7 picks up an IC device 3 by vacuum from a standby tray, not shown, before inspection, and then sets the same on the IC socket 4. After the inspection, the IC device carrier head 7 picks up the IC device 3 from the IC socket 4 to place the same on a product tray, not shown.

When the IC device carrier head 7 is lowered to a position indicated by two-dot chain lines appearing in FIG. 6 and completely sets the IC device 3 on the IC socket 4, the IC device is released from the vacuum nozzle 18. However, since the plurality of device pressers 51 press an upper surface of the IC device 3 against the IC socket 4, the electrical connection between the IC device 3 and the IC tester 44 is maintained.

After the IC device has been set on the IC socket 4, electric current is supplied to the IC device 3 from the IC tester 44 in predetermined patterns according to an inspection program for execution of various tests.

When the inspection is completed, the IC device carrier head 7 picks up the IC device 3 again, and then moves upward from the position indicated by the two-dot chain lines in FIG. 6 to a position indicated by solid lines in the same, to carry the IC device 3 onto the product tray.

This embodiment provides the same effects as obtained from the above described first embodiment. Further, since the plurality of device pressers 51 are mounted at the IC device carrier head 7, it is possible to simplify the construction around the IC device carrier head 7.

It is further understood by those skilled in the art that the foregoing only describes preferred embodiments of the invention, and that various changes and modification may be made without departing from the spirit and scope thereof.

What is claimed is:

1. An IC device inspection apparatus comprising:
   a chamber that receives therein an IC device to be tested;
   an IC tester that judges performance of said IC device;
   an IC socket that electrically connects said IC tester and said IC device;
   a magnetometric sensor that detects a magnetic field generated around said IC device when electric current is supplied to said IC device;
   a converter that converts an output signal from said magnetometric sensor to information indicative of an amount of heat generated by said IC device;
   a temperature control device that controls a temperature of said IC device;
   a control unit that controls the temperature control device to maintain the temperature of said IC device within a predetermined range based on said information indicative of the amount of heat generated by said IC device;
   a device pressing mechanism arranged above said IC socket, said device pressing means comprising two portions which are separated from each other when said IC device is set on said IC socket and when said IC device is removed from said IC socket, and which are coupled together when said IC device is inspected, and said device pressing mechanism further comprising an opening that is defined therein at least during inspection of said IC device and through which said magnetometric sensor detects said magnetic field generated around said IC device and via which said temperature control device controls the temperature of said IC device; and
   an urging member that urges said device pressing mechanism downward so as to press said IC device against said IC socket when said IC device is inspected.

2. An IC device inspection apparatus comprising:
   a chamber that receives therein an IC device that to be tested;
   an IC tester that judges performance of said IC device;
   an IC socket that electrically connects said IC tester and said IC device;
   an IC device carrier head accommodated in said chamber, said IC device carrier head setting said IC device on said IC socket before inspection, and removing and carrying said IC device from said IC socket after said inspection;
   a plurality of device pressers mounted on said IC device carrier head, said device pressers being lowered together with said IC device carrier head when said IC device is inspected so as to press said IC device against said IC socket;
   a magnetometric sensor that detects a magnetic field generated around said IC device when electric current is supplied to said IC device;
   a converter that converts an output signal from said magnetometric sensor to information indicative of an amount of heat generated by said IC device;
   a temperature control device that controls a temperature of said IC device;
   a control unit that controls the temperature control device to maintain the temperature of said IC device within a predetermined range based on said information indicative of the amount of heat generated by said IC device;
   wherein said chamber comprises a bottom plate formed with an opening extending therethrough, and said IC socket is inserted in said opening.

3. An IC device temperature control system comprising:
   a magnetometric sensor that detects a magnetic field generated around an IC device received in a chamber for inspection when electric current is supplied to said IC device;
   a converter that converts an output signal from said magnetometric sensor to information indicative of an amount of heat generated by said IC device;
   a temperature control device that controls a temperature of said IC device;
   a control unit that controls the temperature control device to maintain the temperature of said IC device within a predetermined range based on said information indicative of the amount of heat generated by said IC device.

4. The IC device temperature control system according to claim 3, wherein said control unit adjusts an operating pattern of said temperature control device in accordance with a temperature change of said IC device, based on said information indicative of the amount of heat generated by said IC device.

5. The IC device temperature control system according to claim 3, wherein said magnetometric sensor comprises a magneto-resistive element whose resistance value varies with a strength of said magnetic field generated around said IC device when electric current is supplied to said IC device.

6. The IC device temperature control system according to claim 3, wherein said temperature control device comprises a cooling device that supplies a jet of cold air to said IC device, and
   wherein said control unit controls both of a time period over which said jet of cold air is supplied to said IC device and a flow rate of said jet of said cold air, in a feed forward manner based on said information indicative of the amount of heat generated by said IC device.

7. The IC device temperature control system according to claim 6, wherein said cooling device comprises:
   a cooling nozzle for delivering said jet of said cold air to said IC device, and
   a cooling jacket arranged around said cooling nozzle and through which a refrigerant flows therethrough to thereby inhibit a rise in a temperature of said cold air within said cooling nozzle.

* * * * *